(12) United States Patent
Lin

(10) Patent No.: US 7,579,234 B2
(45) Date of Patent: Aug. 25, 2009

(54) METHOD FOR FABRICATING MEMORY DEVICE WITH RECESS CHANNEL MOS TRANSISTOR

(75) Inventor: Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 10 days.

(21) Appl. No.: 11/960,711

(22) Filed: Dec. 20, 2007

(65) Prior Publication Data
US 2009/0035901 A1    Feb. 5, 2009

(30) Foreign Application Priority Data
Aug. 3, 2007    (TW) .............................. 96128640 A

(51) Int. Cl.
*H01L 21/8242*    (2006.01)
(52) U.S. Cl. ................. 438/243; 438/270; 438/296; 257/296; 257/301
(58) Field of Classification Search ................. 438/243, 438/270, 296, 386; 257/296, 301, E21.09, 257/E21.652
See application file for complete search history.

(56) References Cited

U.S. PATENT DOCUMENTS

| | | | |
|---|---|---|---|
| 7,273,790 B2 * | 9/2007 | Kudelka et al. | 438/386 |
| 2007/0221976 A1 * | 9/2007 | Lee | 257/301 |
| 2007/0224756 A1 * | 9/2007 | Lee et al. | 438/243 |
| 2008/0318388 A1 * | 12/2008 | Lin et al. | 438/386 |

* cited by examiner

*Primary Examiner*—Phuc T Dang
(74) *Attorney, Agent, or Firm*—Winston Hsu

(57) ABSTRACT

A method for fabricating line type recess channel MOS transistors utilizes a lithography process to form line type gate trenches in the line type recess channel MOS transistors before finishing a STI process. The method can further control the critical dimension variation in a range required in precision semiconductor processes. Therefore, the short problem between the transistors can be avoided.

6 Claims, 10 Drawing Sheets

METHOD FOR FABRICATING MEMORY DEVICE WITH RECESS CHANNEL MOS TRANSISTOR

BACKGROUND OF THE INVENTION

1. Field of the Invention

The present invention relates to a method for fabricating semiconductor devices. More specifically, the present invention relates to a method for fabricating a Metal-Oxide-Semiconductor (MOS) transistor device with a recess channel of a trench type Dynamic Random Access Memory (DRAM).

2. Description of the Prior Art

Integrated circuit devices are continually being made smaller in order to increase speed, make the device more portable and to reduce the cost of manufacturing the device. However, certain designs have a minimum feature size, which cannot be reduced without compromising the integrity of electrical isolation between devices and consistent operation of the device. For example, dynamic random access memory devices (DRAMs), which use vertical metal oxide semiconductor field effect transistors (MOSFETs) with deep trench (DT) storage capacitors, have a minimum feature size of approximately 70 nm~0.15 µm. Below that size, the internal electric fields exceed the upper limit for storage node leakage, which decreases retention time below an acceptable level. Therefore, there is a need for different methods and/or different structures to further reduce the size of integrated circuit devices.

With the continued reduction in device size, sub-micron scale MOS transistors must overcome many technical challenges. As MOS transistors become narrower (that is, their channel length decreases), problems such as junction leakage, source/drain breakdown voltage, and data retention time become more pronounced.

One solution to decreasing the physical dimension of ULSI circuits is to form recessed-gate or "trench-type" transistors, which have a gate electrode buried in a groove formed in a semiconductor substrate. This type of transistor reduces short channel effects by effectively lengthening the effective channel length by having the gate extend into the semiconductor substrate.

The recessed-gate MOS transistor has a gate insulation layer formed on the sidewalls and bottom surface of a recess etched into a substrate, a conductive filling the recess, contrary to a planar gate type transistor having a gate electrode formed on a planar surface of a substrate.

However, the aforesaid recessed-gate technology has some shortcomings. For example, gate trenches of the conventional hole type recess channel MOS transistor device are formed in the semiconductor substrate by utilizing a lithography process and dry etching process. When utilizing the lithography process to form the hole type gate trenches, the hole contour is not easy to control, and the critical dimension variation cannot be controlled in a range (3 sigma, 15 nm) required in semiconductor processes under 60 nm. Therefore, the short problem between the transistors will occur.

SUMMARY OF THE INVENTION

It is one objective of this invention to provide a method for fabricating a MOS transistor with a recess channel to solve the abovementioned problems.

According to the claimed invention, a method for fabricating a line-typed recess channel MOS transistor device includes: providing a semiconductor substrate having a main surface and a plurality of line-typed recess channels; forming a dielectric layer on each of the line-typed recess channels; forming a sacrificial layer on the dielectric layer, wherein a surface of the sacrificial layer is lower than the main surface of the semiconductor substrate; forming a plurality of trench capacitors in the semiconductor substrate, wherein each of the trench capacitors has a trench top oxide (TTO), and a surface of each TTO is higher than the main surface of the semiconductor substrate; forming a plurality of shallow trench isolation (STI) structures vertically interlacing with each of the line-typed recess channels to form a plurality of recess channels for each of the line-typed recess channels; removing the sacrificial layer and the dielectric layer; forming a gate dielectric layer in each of the recess channels and fulfill a first polysilicon layer therein; etching back the first polysilicon layer and the gate dielectric layer and forming an internal spacer on sidewalls of each of the recess channels; and forming a first gate material layer in each of the recess channels.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
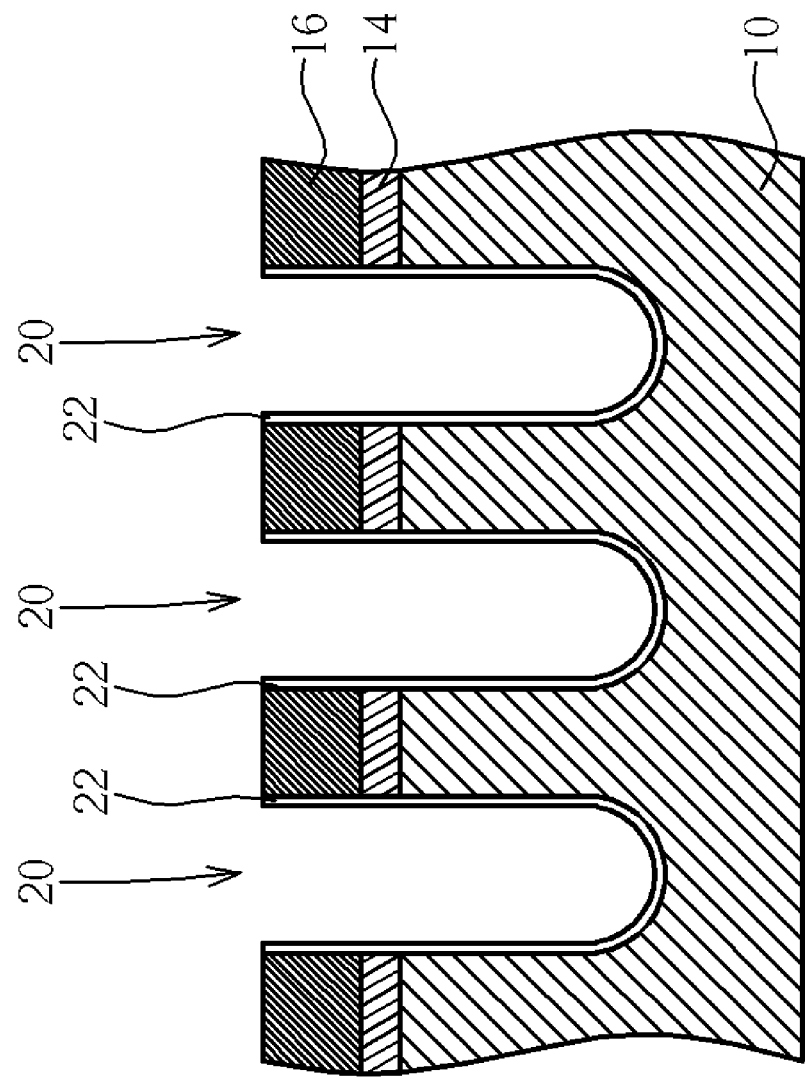
FIGS. 1-2 are cross-sectional schematic diagrams illustrating an exemplary method of fabricating a line-typed recess channel MOS transistor device in accordance with the preferred embodiment of this invention.
Figure 2:
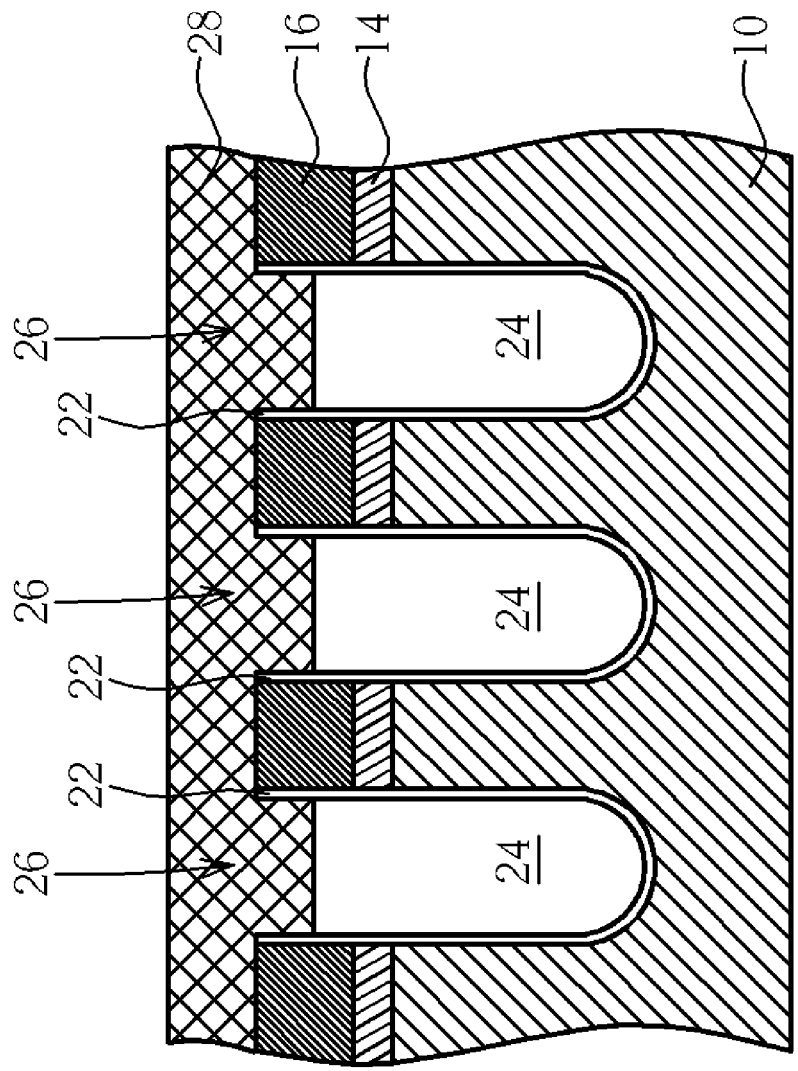
Figure 3:
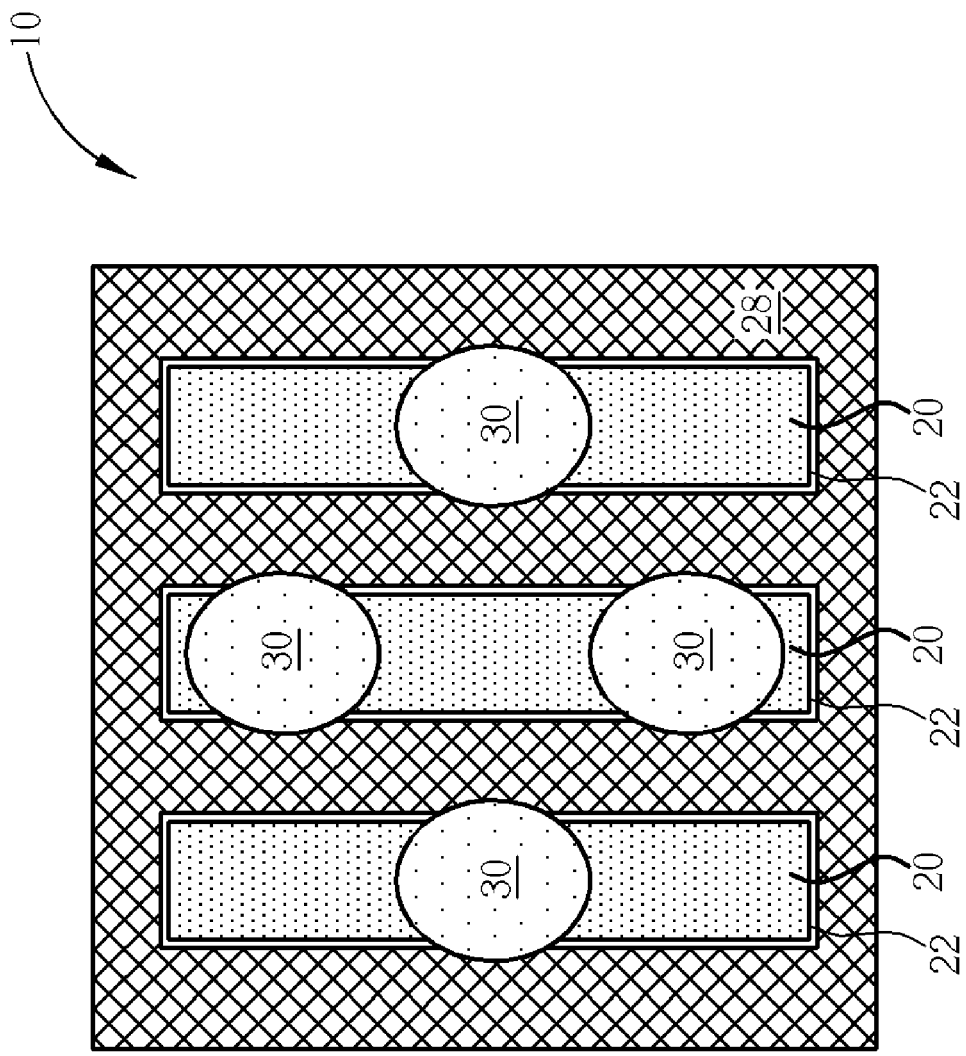
FIG. 3-4 are top-view schematic diagrams showing the layout of the deep trench capacitors in the memory array area according to this invention.
Figure 4:
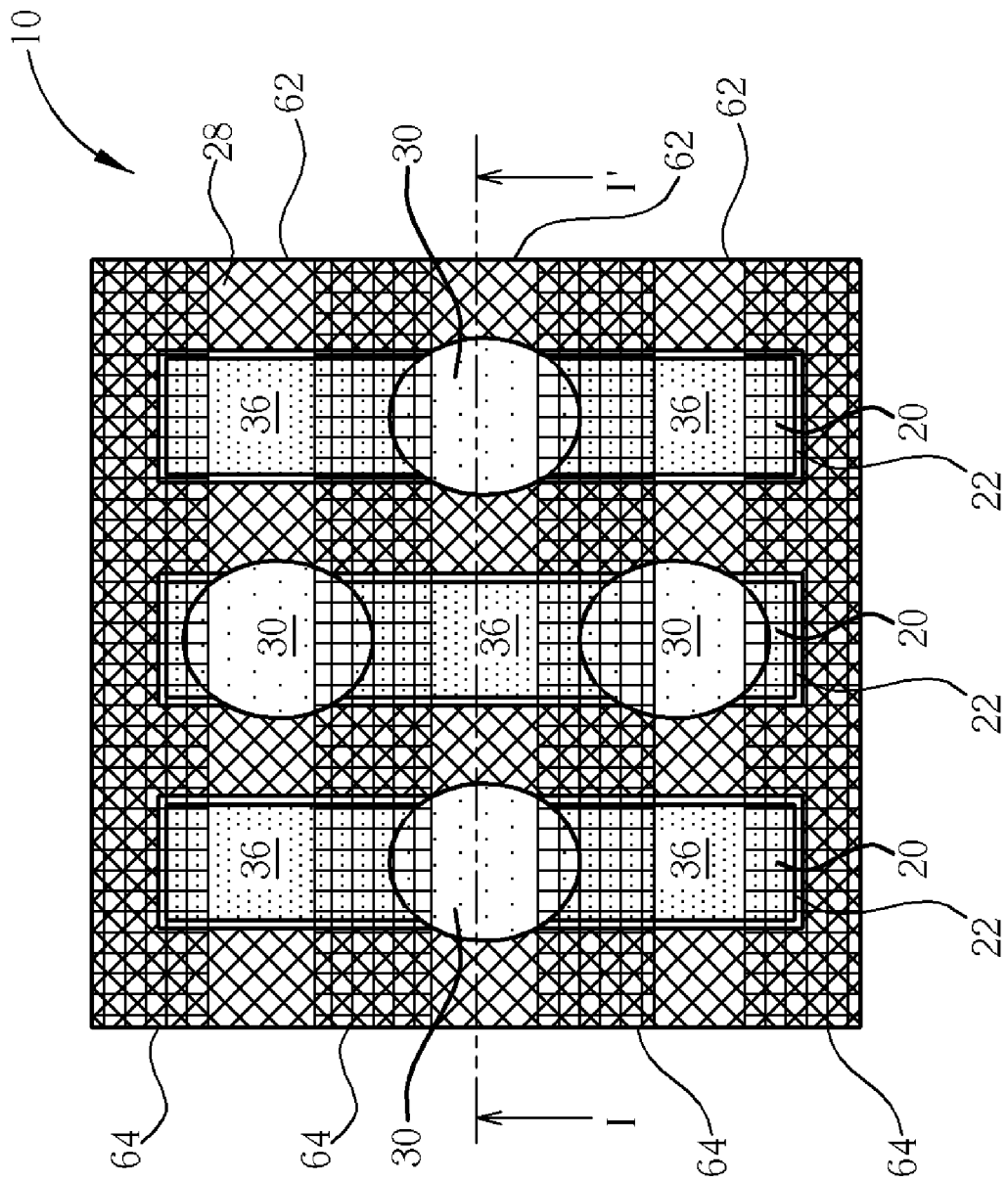

Please refer to FIGS. 1-10. FIGS. 1-2 are cross-sectional schematic diagrams illustrating an exemplary method of fabricating a line-typed recess channel MOS transistor device in accordance with the preferred embodiment of this invention. FIG. 3-4 are top view schematic diagrams showing the layout of the deep trench capacitors in the memory array area according to this invention. FIGS. 5-10 are three-dimensional schematic diagrams illustrating an exemplary method of fabricating a line-typed recess channel MOS transistor device in accordance with the preferred embodiment of this invention.

As shown in FIG. 1, a pad oxide layer 14, a pad nitride layer 16, and a photoresist layer (not shown) are first formed on the memory array area of a semiconductor substrate 10 in sequence, wherein the photoresist layer is defined with a line pattern. Next, the photoresist layer is used as an etching mask to etch the pad nitride layer 16, the pad oxide layer 14, and the semiconductor substrate 10 to form a plurality of line-typed recess channels 20. Next, a dielectric layer 22, such as a tetra-ethyl-ortho-silicate (TEOS) CVD deposition layer, is formed on the sidewall and bottom of each of the line-typed recess channels 20. The dielectric layer 22 is not limited to be formed by the CVD process, and can also be formed by a thermal oxidation method.

Next, as shown in FIG. 2, a sacrificial layer 24 is deposited to full-fill each of the line-typed recess channels 20, and then the sacrificial layer 24 is partially removed such that the top surface of the sacrificial layer 24 is lower than the top surface of the pad nitride layer 16 to form a recess opening 26. The bottom surface of the recess opening 26 is higher than the main surface of the semiconductor substrate 10. Next, a silicon nitride top layer 28 is formed on the pad nitride layer 16 and filled in the opening 26.

As shown in FIG. 3, after the line-typed recess channels 20 are formed, a plurality of trench capacitors 30 are formed in the semiconductor substrate 10 with an array arrangement. The trench capacitors 30 are formed inside the line-typed recess channels 20 and cut the line-typed recess channels 20 to define a plurality of small sections. The trench capacitors 30 include a Single-Side Buried Strap (SSBS) respectively, and the process of forming the trench capacitors 30 is the ordinary skill and not mentioned in the embodiment.

Next, as shown in FIG. 4, the following steps are performed to define the active areas 62 and shallow trench isolation (STI) areas 64 in the semiconductor substrate 10: (1) deposition of a boron doped silicate glass (BSG) layer; (2) deposition of a polysilicon layer; (3) lithographic and etching process for defining the active areas in the support circuit region; (4) oxidation for oxidizing the active areas in the support circuit region; and (5) trench filling for the STI and chemical mechanical polishing. The STI areas 64 are across each of the line-typed recess channels 20 to define a plurality of recess channels 36. Please note the steps are not limited to those detailed here.

Figure 5:
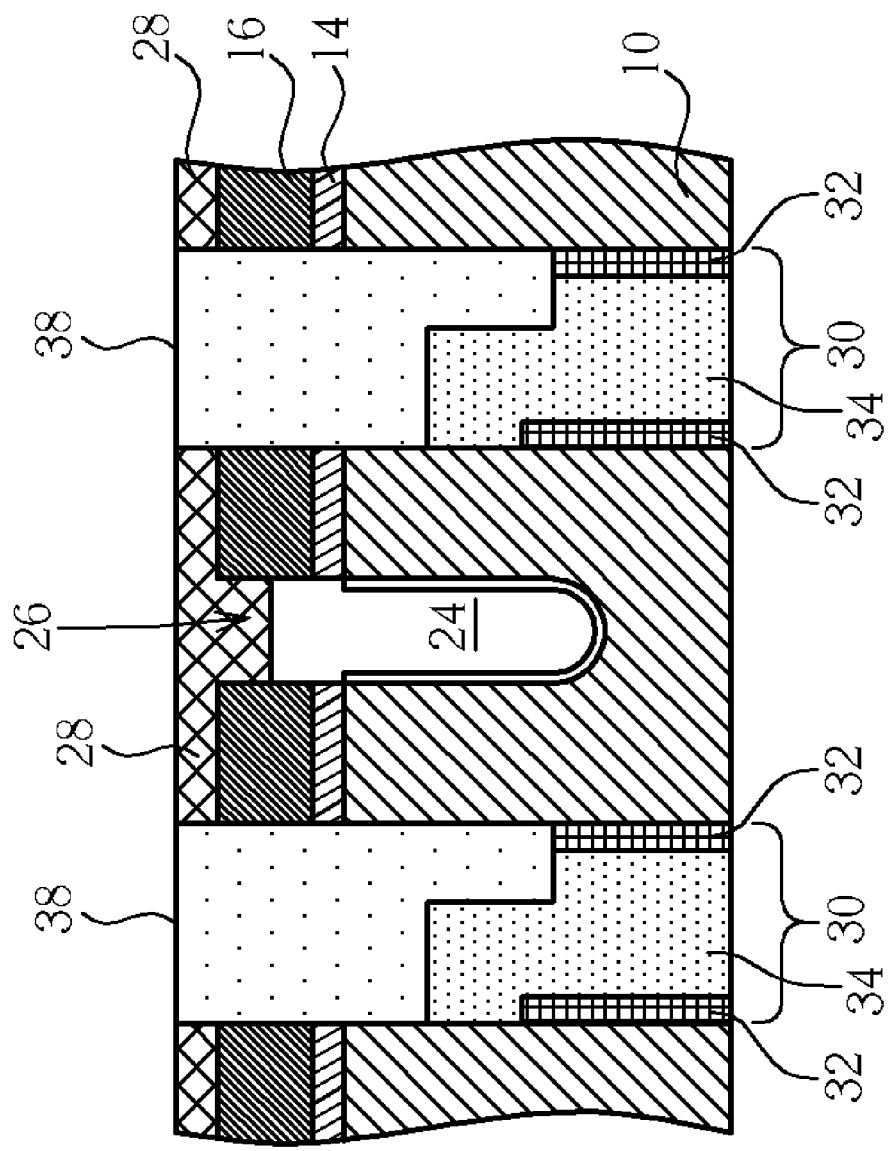
FIGS. 5-10 are three-dimensional schematic diagrams illustrating an exemplary method of fabricating a line-typed recess channel MOS transistor device in accordance with the preferred embodiment of this invention.

FIG. 5 shows the I-I' cross-sectional structure in FIG. 4. As shown in FIG. 5, the trench capacitors 30 includes a sidewall capacitor dielectric layer 32 and a doped polysilicon layer 34. The capacitor structure (not shown) under the trench capacitors 30 includes an upper electrode plate, a dielectric layer, and a buried electrode plate.

The trench capacitors 30 fabricated using a Single-Sided Buried Strap (SSBS) process is shown in FIG. 5. The method of fabricating the trench capacitors 30 is known in the art, and thus further explanation of the detailed fabricating process are omitted herein for the sake of brevity. Additionally, there is a trench top oxide (TTO) layer 38 on each of the trench capacitors 30.

Figure 6:
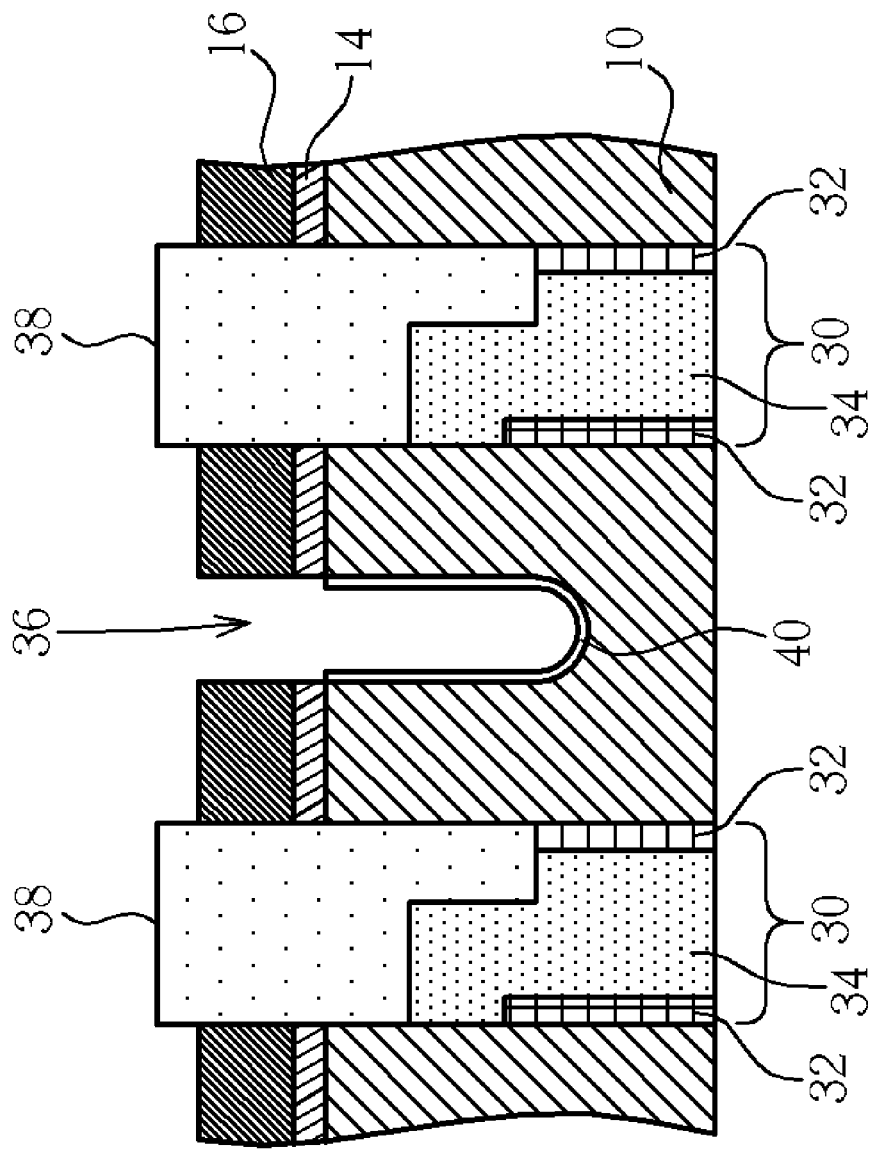

Next, as shown in FIG. 6, an etching process, such as a wet etching process, is performed to remove the silicon nitride top layer 28 with, for example, phosphorus acid to expose the recess opening 26, and remove the sacrificial layer 24 and the dielectric layer 22 from the recess channel 36. At this time, the TTO layer 38 is protruded over the surface of the pad nitride layer 16. Next, an ion implantation process is performed to form different doped areas or ion wells (not shown) in the semiconductor substrate 10. Then, a gate dielectric layer 40 is formed on sidewall and bottom of the recess channels 36 by thermal or deposition process.

Figure 7:
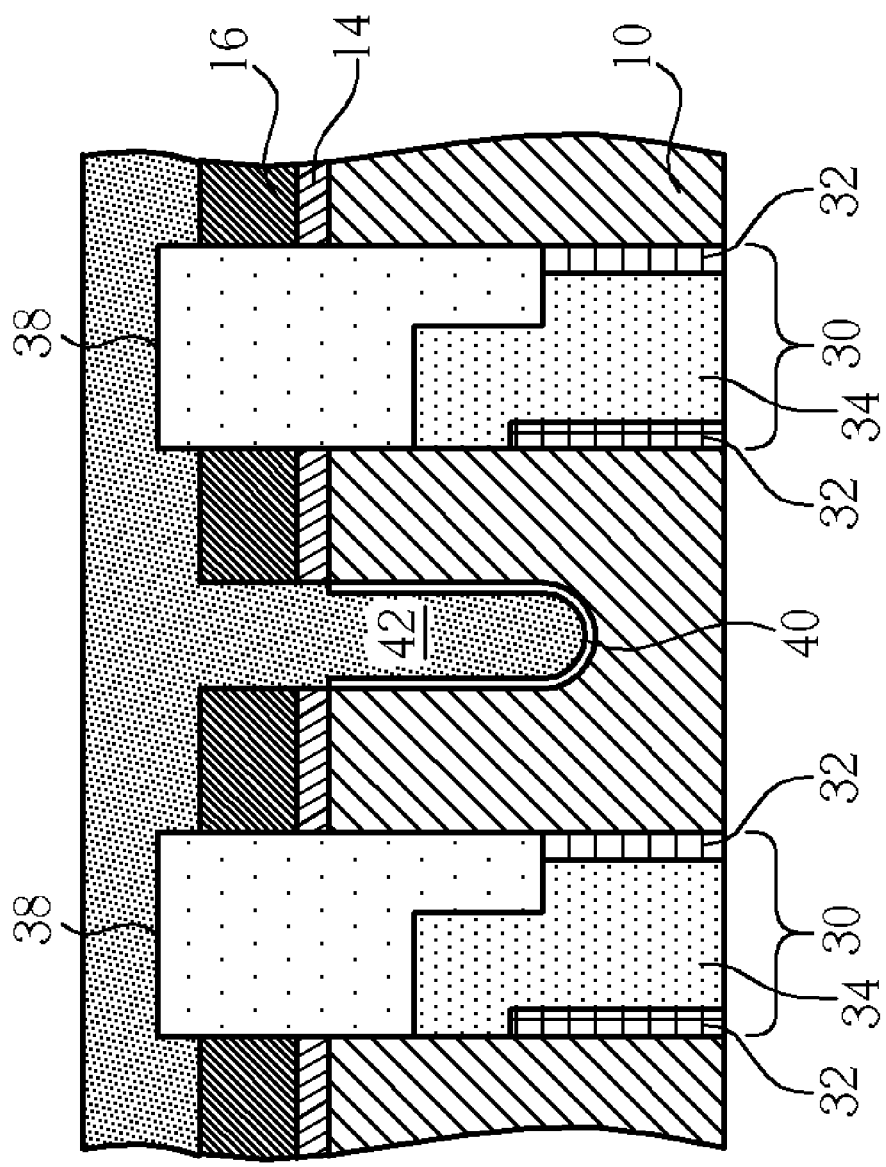
Figure 8:
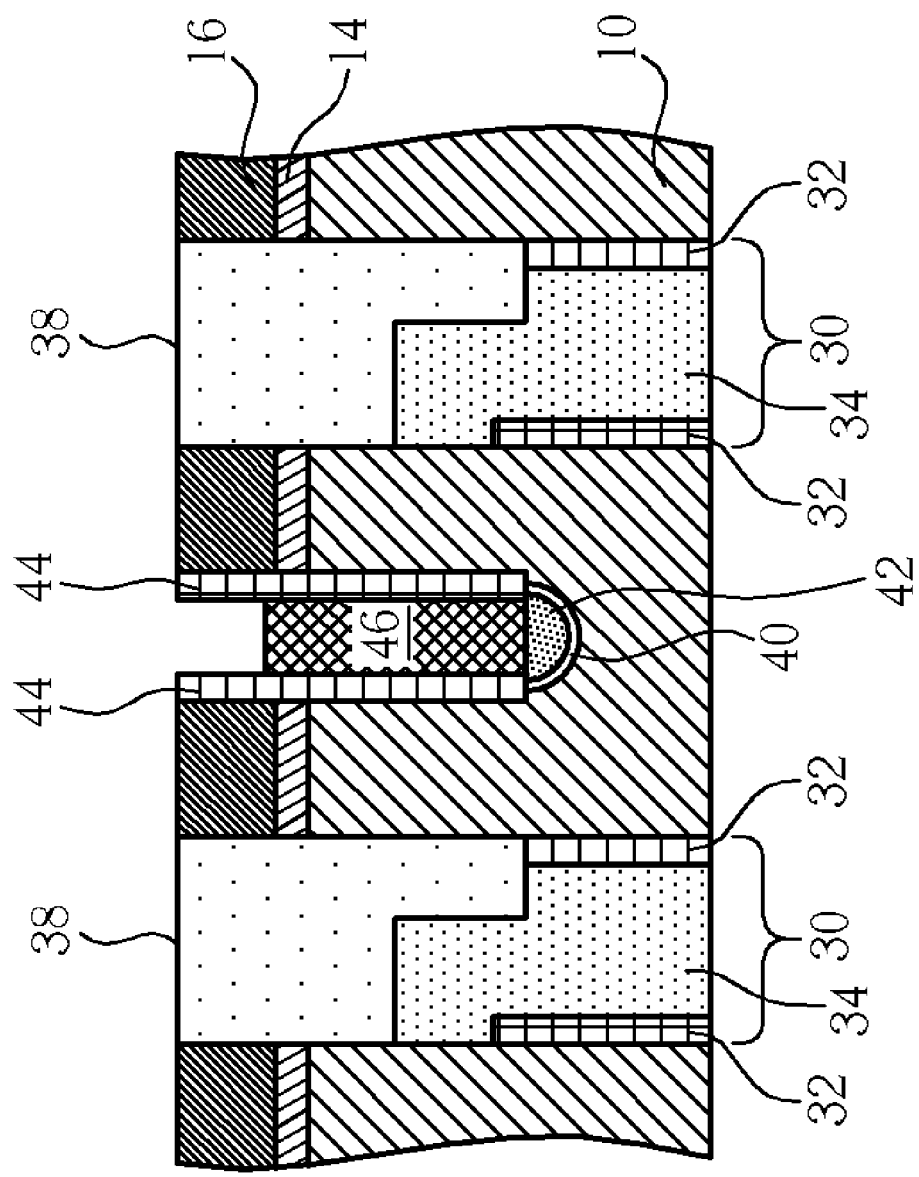

Next, as shown in FIG. 7, a first polysilicon layer 42 is formed on the semiconductor substrate and full-filled the recess channel 36. Then, as shown in FIG. 8, the first polysilicon layer 42 is partially removed by, for example, an etching process to a predetermined depth, and an inner spacer 44 is formed on sidewalls of each recess channel 36. Next, a first gate material layer 46 is formed on the first polysilicon layer 42 in the recess channels 36. Then, a planarization process such as a chemical mechanical polishing (CMP) process is performed to make the surface of the TTO layer 38 and the surface of the pad nitride layer 16 are coplanar. Next, an etching process is performed to etch a part of the first gate material layer 46 such that the top surface of the first gate material layer 46 is lower than that of the pad nitride layer 16 but is still higher than the main surface of the semiconductor substrate 10.

Figure 9:
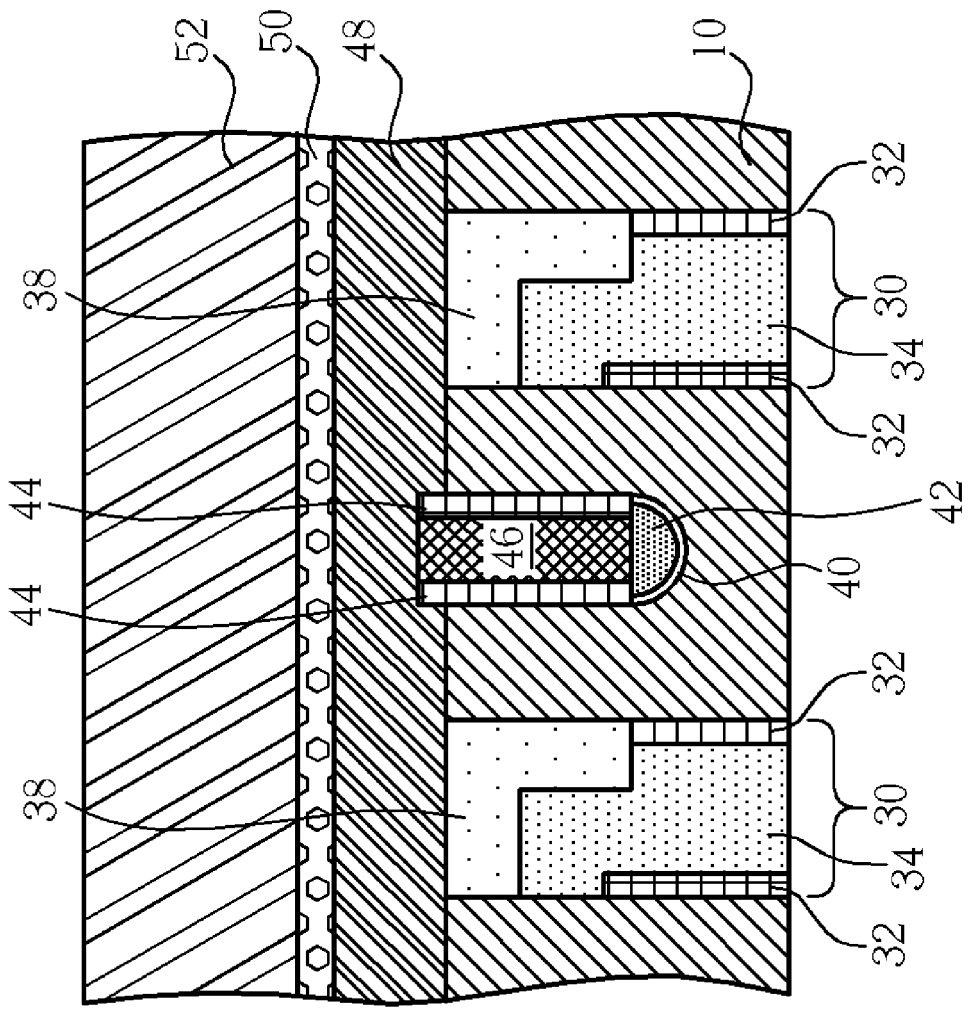

Next, as shown in FIG. 9, an etching process, such as a wet etching process, is performed to remove the pad nitride layer 16 and the pad oxide layer 14 with, for example, phosphorus acid. A second gate material layer 48 is formed on the semiconductor substrate 10, the TTO layer 38, and the first gate material layer 46 in the recess channels 36. Then, a tungsten (W) metal layer 50 and a silicon nitride layer 52 are deposited on the second gate material layer 48 in sequence.

Figure 10:
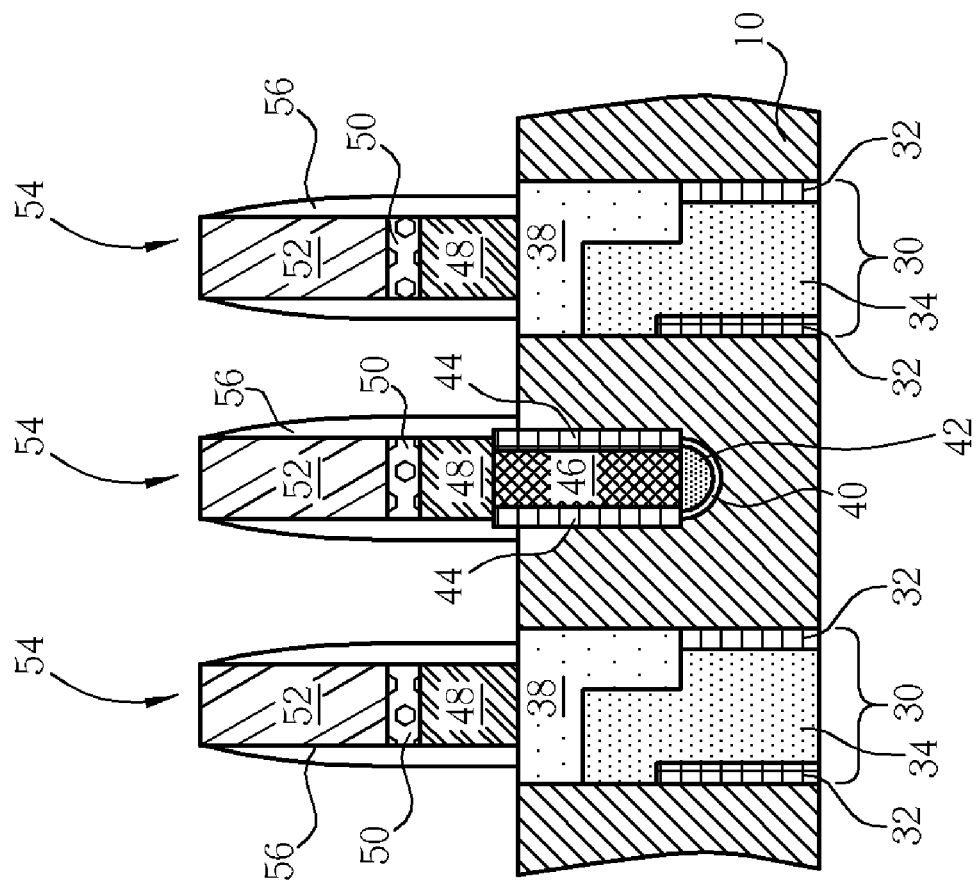

Next, as shown in FIG. 10, a patterning process in performed on the second gate material layer 48, the tungsten metal layer 50 and the silicon nitride layer 52 to form the gate conductor 54 on the recess channel 36 and the trench capacitor 30. The spacer 56 is formed on a sidewall of the gate conductor 54. The source and drain are formed in the substrate by the ion implantation process.

The method for fabricating a line-typed recess channel MOS transistor device of the present invention utilizes a lithography process to form line-typed gate trenches in the line-typed recess channel MOS transistor device before finishing a STI process, and thus the critical dimension variation can be controlled in a range (3 sigma, 8 nm) required in the precision semiconductor process under 60 nm. Therefore, the short problem between the transistors can be avoided.

Those skilled in the art will readily observe that numerous modifications and alterations of the device and method may be made while retaining the teachings of the invention.

What is claimed is:

1. A method for fabricating a memory device consisting essentially of:
   defining multiple trenches in a substrate;
   partially deepening each of the trenches so as to form trench capacitors in each of the deepened trenches; and
   forming a gate between every two adjacent trench capacitors in the trenches;
   wherein the trench capacitors are formed with an array arrangement.

2. The memory device fabricating method as claimed in claim 1, wherein the plurality of line-typed trenches are parallel to each other.

3. The memory device fabricating method as claimed in claim 1 further comprising forming isolation areas between the plurality of the trench capacitors.

4. A method for fabricating a line type recess channel MOS transistor device, comprising:
   providing a semiconductor substrate having a main surface and a plurality of line type recess channels;
   forming a dielectric layer on each of the line type recess channels;
   forming a sacrificial layer on the dielectric layer, wherein a surface of the sacrificial layer is lower than the main surface of the semiconductor substrate;
   forming a plurality of trench capacitors in the semiconductor substrate, wherein each of the trench capacitors has a trench top oxide (ITO) layer, and a surface of each ITO layer is higher than the main surface of the semiconductor substrate;
   forming a plurality of shallow trench isolation (STI) structures vertically interlacing with each of the line type recess channels to form a plurality of recess channels for each of the line type recess channels;
   removing the sacrificial layer and the dielectric layer;
   forming a gate dielectric layer in each of the recess channels and filling a first polysilicon layer therein;
   etching back the first polysilicon layer and the gate dielectric layer and forming an internal spacer on sidewalls of each of the recess channels; and
   forming a first gate material layer in each of the recess channels.

5. The method for fabricating the line type recess channel MOS transistor device of claim 4, further comprising:

forming a second gate material layer on the semiconductor substrate, each ITO layer, and each of the recess channels;

forming a gate conductor on each of the recess channels and each of the trench capacitors; and forming a spacer on a sidewall of the gate conductor.

6. The method for fabricating the line type recess channel MOS transistor device of claim 5, wherein materials of the second gate material layer comprises polysilicon, TiN, WN, and W.

* * * * *